United States Patent
Kucukcakar et al.

(10) Patent No.: US 7,552,409 B2
(45) Date of Patent: Jun. 23, 2009

(54) ENGINEERING CHANGE ORDER PROCESS OPTIMIZATION

(75) Inventors: Kayhan Kucukcakar, Sunnyvale, CA (US); Jing C. Lin, Cupertino, CA (US); Jinan Lou, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 323 days.

(21) Appl. No.: 11/147,814

(22) Filed: Jun. 7, 2005

(65) Prior Publication Data

US 2006/0277512 A1 Dec. 7, 2006

(51) Int. Cl.
*G06F 17/50* (2006.01)
(52) U.S. Cl. .................... 716/5; 716/6; 703/16
(58) Field of Classification Search ...... 716/5, 716/6; 703/16
See application file for complete search history.

(56) References Cited

U.S. PATENT DOCUMENTS

| | | | | |
|---|---|---|---|---|
| 5,764,528 A * | 6/1998 | Nakamura | ...... | 716/6 |
| 6,397,373 B1 * | 5/2002 | Tseng et al. | ...... | 716/5 |
| 6,799,308 B2 * | 9/2004 | You et al. | ...... | 716/6 |
| 7,017,131 B2 * | 3/2006 | Barnes | ...... | 716/6 |
| 7,284,215 B1 * | 10/2007 | Kim et al. | ...... | 716/6 |
| 7,331,028 B2 * | 2/2008 | Dinter et al. | ...... | 716/11 |
| 2001/0049814 A1 * | 12/2001 | Matsumoto et al. | ...... | 716/10 |
| 2003/0159118 A1 * | 8/2003 | Lindkvist | ...... | 716/5 |
| 2004/0123259 A1 * | 6/2004 | You et al. | ...... | 716/6 |
| 2006/0026546 A1 * | 2/2006 | Dinter et al. | ...... | 716/11 |

FOREIGN PATENT DOCUMENTS

JP 10335467 A * 12/1998

\* cited by examiner

*Primary Examiner*—Phallaka Kik
(74) *Attorney, Agent, or Firm*—Bever, Hoffman & Harms, LLP; Jeanette S. Harms (57) ABSTRACT

A method for reaching signoff closure in an ECO (engineering change order) process involves the use of violation context data from the signoff tool as the basis for design layout modifications in an implementation tool. The violation context data includes violation information other than violation location/path information. Because the signoff tool, and more specifically, the signoff algorithm used by that tool is the most accurate model of actual IC behavior, the use of violation context data generated by the signoff tool to implement changes to the design layout will generally produce appropriate and effective results. By accessing this violation context data from the signoff tool, an implementation tool need not rely on its less accurate implementation analysis to determine the optimal design layout modifications for correcting violations detected by the signoff tool.

22 Claims, 5 Drawing Sheets

ENGINEERING CHANGE ORDER PROCESS OPTIMIZATION

BACKGROUND OF THE INVENTION

1. Field of the Invention

The invention relates to the field of integrated circuit design, and in particular, to a system and method for efficiently and effectively completing the engineering change order process for an integrated circuit design.

2. Related Art

Figure 1:
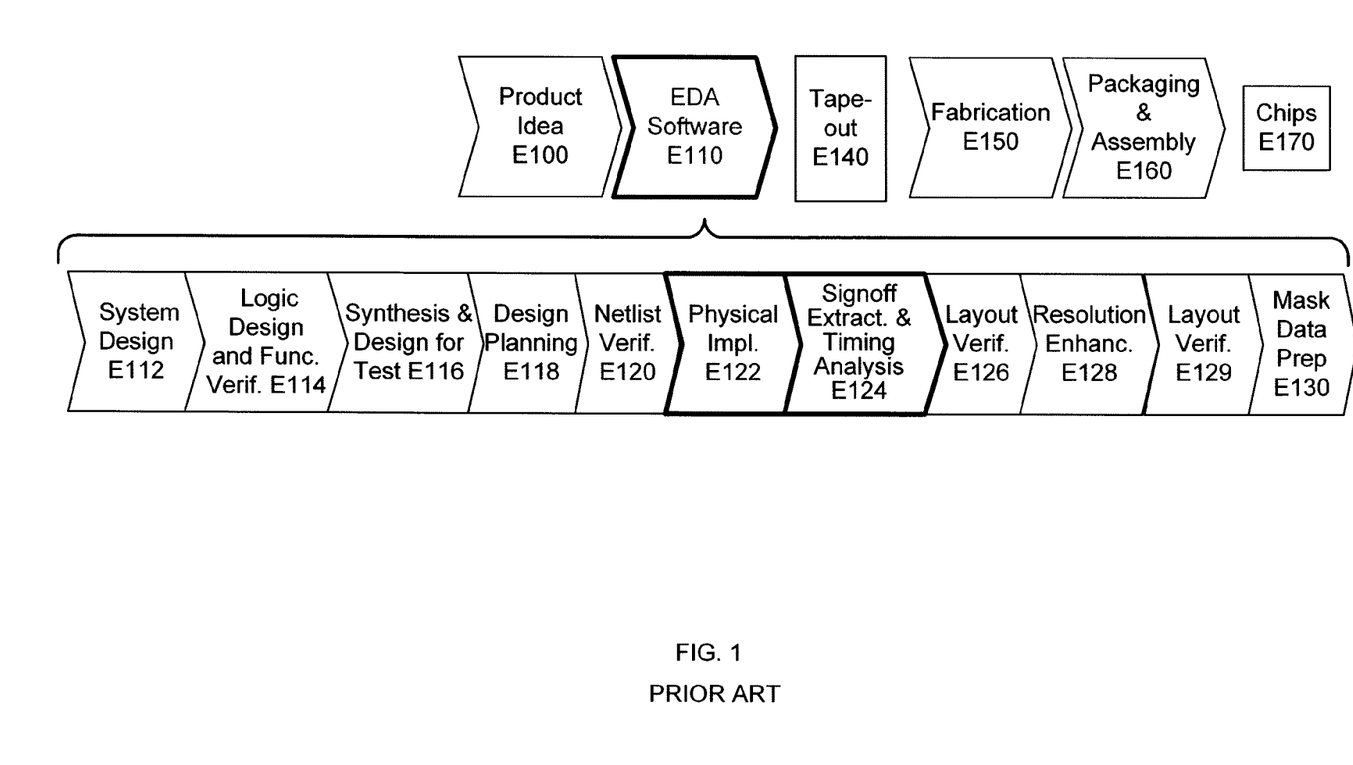
FIG. 1 is a simplified flow diagram of a standard EDA process flow.

Modern integrated circuit (IC) designs are typically performed using highly automated processes known generally as electronic design automation (EDA). By automating much of the IC development and analysis process, EDA tools enable the design of the highly complex chips used in modern electronic devices. For example, FIG. 1 shows a simplified representation of an exemplary digital ASIC design flow. At a high level, the process starts with the product idea (step E100) and is realized in an EDA software design process (step E110). When the design is finalized, it can be taped-out (event E140). After tape out, the fabrication process (step E150) and packaging and assembly processes (step E160) occur resulting, ultimately, in finished chips (result E170).

The EDA software design process (step E110) is actually composed of a number of steps E112-E130, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the component steps of the EDA software design process (step E110) will now be provided. During system design (step E112), the designers describe the functionality that they want to implement and can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

During logic design and functional verification (step E114), the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS, VERA, DesignWare®, Magellan, Formality, ESP and LEDA products.

During synthesis and design for test (step E116), the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Physical Compiler, Test Compiler, Power Compiler, FPGA Compiler, Tetramax, and DesignWare® products.

During design planning (step E118), an overall floorplan for the chip is constructed and analyzed for timing and top-level routing. Exemplary EDA software products from Synopsys, Inc. that can be used at this step include Jupiter and Floorplan Compiler products.

During netlist verification (step E120), the netlist is checked for compliance with timing constraints and for correspondence with the VHDL/Verilog source code. Exemplary EDA software products from Synopsys, Inc. that can be used at this step include VCS, VERA, and Formality products.

During physical implementation (step E122), placement (positioning of circuit elements) and routing (connection of the same) is performed. Exemplary EDA software products from Synopsys, Inc. that can be used at this step include the Astro product.

During signoff extraction and timing analysis (step E124), the circuit function is verified at a transistor or gate level, which in turn permits what-if refinement. Exemplary EDA software products from Synopsys, Inc. that can be used at this step include Star RC/XT, Raphael, Aurora, and PrimeTime products.

During layout verification (step E126), various checking functions are performed to ensure correctness for manufacturing, electrical issues, lithographic issues, and circuitry. Exemplary EDA software products from Synopsys, Inc. that can be used at this step include the Hercules product.

During resolution enhancement (step E128), geometric manipulations of the layout are performed to improve manufacturability of the design. Exemplary EDA software products from Synopsys, Inc. that can be used at this step include the iN-Phase, Proteus, and AFGen products.

After resolution enhancement (step E128), another layout verification operation (step E129) can be performed to ensure that the geometric manipulations performed during step E128 have not introduced any unintended problems (e.g., mask manufacturing rule violations and layout patterns that could cause lithographic defects). An exemplary EDA software product from Synopsys, Inc. that can be used at this step is the SiVL product.

Finally, during mask data preparation (step E130), the "tape-out" data for production of masks for lithographic use to produce finished chips is performed. Mask data preparation is sometimes referred to as "mask synthesis". Exemplary EDA software products from Synopsys, Inc. that can be used at this step include the CATS(R) family of products.

Once the EDA process reaches the tape-out phase (step E130), any changes to the design become extremely expensive, both in terms of dollar cost and production delays. Therefore, it is extremely important that once the design is finalized by the signoff operation (step E124), no additional design modifications be made (except for layout "clean up" modifications such as in steps E126 and E128). The signoff process therefore involves a detailed analysis of the IC design. Typically, this analysis is based on the timing requirements of the IC, although other performance-related aspects such as power consumption, ESD resistance, or noise can be evaluated during the signoff process.

Figure 2:
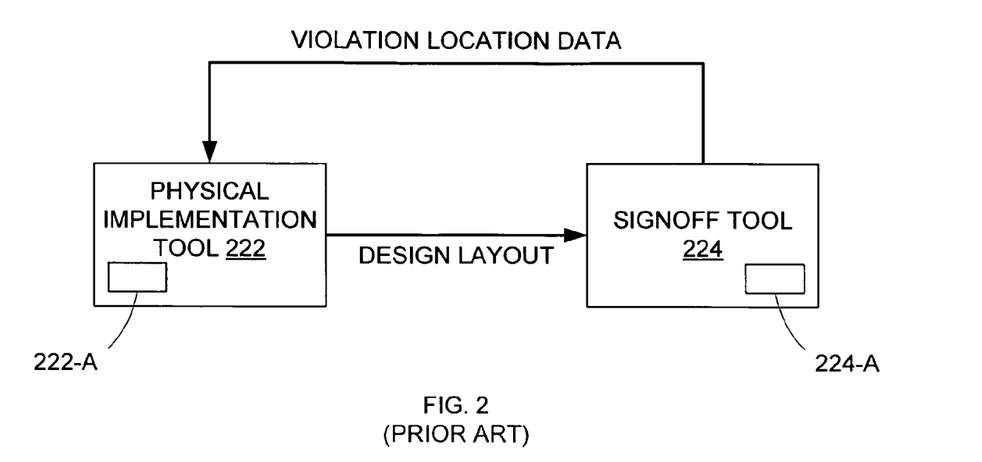
FIG. 2 is a block diagram of an implementation tool and a signoff tool performing a conventional ECO process to reach signoff closure.

Steps E122 and E124 in FIG. 1 are sometimes referred to as the "ECO (engineering change order) process". Any violations, such as timing errors, that are detected during signoff (step E124) become the subject of ECOs that result in layout modifications by the physical implementation tool (step E122). FIG. 2 depicts the process flow between a physical implementation tool 222 and a signoff tool 224 for a conventional ECO process. During physical implementation (step E122), physical implementation tool 222 generates a design layout for an IC. This design layout is passed to signoff tool 224, which includes a signoff analysis module 224-A for performing a signoff analysis (step E124) on the design layout to check for proper device performance (e.g., proper circuit timing). Each violation (i.e., discrepancy between the design specification and the modeled performance of the design layout) that is detected by signoff analysis module 224-A is identified by the specific location of that violation. In some cases, the location of a violation is specified by indicating the "path" in which the violation occurs. A "path" in a layout refers to an electrical signal path (i.e., the series of interconnects and devices) between two nodes in the layout. Typically, a path includes multiple segments (i.e., connections between devices), although in certain situations, a path may consist of only one segment.

Signoff tool 224 passes the violation location data back to physical implementation tool 222, which attempts to correct the design layout to eliminate the violations and generate an updated design layout. The updated design layout is then re-analyzed by signoff tool 224, and any new or remaining violations are again passed to the implementation tool. The process continues looping in this manner until signoff tool 224 no longer detects any violations (i.e., timing closure is achieved), at which point the design layout can be submitted to downstream tools for final processing (e.g., steps E126-E130 in FIG. 1) and tape-out.

Note that physical implementation tool 222 includes an implementation analysis module 222-A. Implementation analysis module 222-A allows physical implementation tool 222 to attempt to generate a design layout that meets the specified performance requirements. Typically, implementation analysis module 222-A allows implementation tool 222 to perform its own "what if" analyses to evaluate a range of different layouts to determine a layout design that best meets the performance specification. However, to enable efficient design layout generation, the algorithm used by implementation analysis module 222-A is less rigorous than the algorithm used by signoff analysis module 224-A in signoff tool 224. Specifically, the analytical models used in the implementation algorithm are less complex and less precise than the analytical models used in the signoff algorithm so that physical implementation can be performed in a relatively short period of time.

Furthermore, an implementation tool (222) will typically only simulate a small number of operating conditions for the design. For example, a mobile computing processor chip may have a number of different operating modes (e.g., sleep mode, standby mode, and active mode), with each mode having a different set of operating constraints. The chip may also need to operate over a range of temperatures that can also affect chip performance. Because the implementation process deals with an IC design that is undergoing many design changes, evaluating every single combination of operating conditions for each different design would be prohibitively time-consuming and expensive. Therefore, an implementation algorithm only evaluates a few operating condition combinations that are deemed to be representative of the universe of operating conditions. On the other hand, since the signoff tool (224) is ostensibly dealing with a firm design, the signoff algorithm can evaluate that design using a much more comprehensive set of operating conditions, and may therefore detect problems for combinations of operating conditions that were not considered by implementation tool 222. However, for this same reason, the runtime of signoff tool 224 is much greater than the runtime of implementation tool 222. For example, an implementation analysis performed on a design layout may take several hours to complete, while a signoff analysis performed on the same design layout might take several days to complete.

Thus, while the implementation algorithm is optimized for efficiency, the signoff algorithm is optimized for accuracy. The enhanced analytical fidelity of the signoff algorithm allows signoff tool 224 to detect violations in the design layouts generated by implementation tool 222 (i.e., violations that were not detected by implementation analysis module 222-A). Signoff tool 224 therefore prevents those violations from propagating any further downstream, where corrections become much more expensive and difficult. Unfortunately, even though signoff tool 224 identifies the violations by location/path, implementation tool 222 cannot effectively address violations identified in such a manner, since implementation analysis module 222-A was unable to detect those violations in the first place. Therefore, user inputs (e.g., ECOs) are typically required to evaluate the violations and suggest possible solutions that guide implementation tool 222 in making modifications to the design layout. However, because a user cannot be expected to generate ideal solutions for the complex circuit design, the ECO process typically loops back and forth between signoff tool 224 and physical implementation tool 222 (i.e., between steps E224 and E222 in FIG. 1) many times, which can significantly increase the overall design time for the IC.

Accordingly, it is desirable to provide a system and method for minimizing the number of cycles required for the ECO process, while still detecting and correcting violations detected by the signoff analysis.

SUMMARY OF THE INVENTION

The conventional ECO (engineering change order) process used to complete signoff of an IC design layout is significantly hampered by the fact that a physical implementation tool is used to make layout modifications based on violation path data from a signoff tool. Specifically, because the analysis performed by the physical implementation tool is significantly less precise than the analysis performed by the signoff tool, the violations detected by the signoff tool are actually not detectable by the implementation tool. Therefore, dealing with those violations using the implementation tool can be a somewhat haphazard, and hence very time-consuming, process. By enabling the transfer of context information for violations (along with the location/path information for those violations) from the signoff tool to the implementation tool, and by enabling the use of that context information in the subsequent layout modifications by the implementation tool, a layout meeting signoff requirements can be efficiently generated.

Because the signoff tool, and more specifically, the signoff algorithm used by that tool is ostensibly the most accurate model of actual IC behavior, the use of violation context data generated by the signoff tool to implement changes to the design layout will generally produce the most appropriate and effective results. In other words, the violation context data extracted by the signoff analysis provides the best guide for correcting the violations detected by the signoff analysis. Thus, in one embodiment, a method for performing an ECO process comprises analyzing a design layout using a signoff algorithm to detect a set of violation paths and associated violation context data, and then implementing changes to the design layout (e.g., using an implementation tool) based on that set of violation paths and violation context data. In various embodiments, timing, power consumption, noise, voltage stability, crosstalk delay, critical DRC (design rule checking), electron migration, signal transition time, and/or parasitic extraction signoff algorithms can be used in this ECO process. In one embodiment, the use of violation context data can eliminate the need for manual ECO entry to guide the process to signoff closure.

In another embodiment, a signoff tool can include logic for analyzing a design layout using a signoff algorithm, logic for providing a set of violation paths based on that signoff analysis, and logic for providing violation context data for some or all of the violation paths. The signoff algorithm can be a timing, power consumption, noise, voltage stability, crosstalk delay, critical DRC performance, electron migration, signal transition time, and/or parasitic extraction analysis algorithm, and/or any other type of signoff algorithm.

In another embodiment, an implementation tool can include logic for receiving violation path and violation context data from a signoff tool, and logic for modifying a design layout based on the violation context data to correct the violations associated with the violation paths. The violation paths and violation context data can be associated with timing, power consumption, noise, voltage stability, crosstalk delay, critical DRC performance, electron migration, signal transition time, and/or parasitic extraction violations, or with any other type of signoff violation.

The invention will be more fully understood in view of the following description and drawings.

DETAILED DESCRIPTION

The conventional ECO (engineering change order) process used to complete signoff of an IC design layout is significantly hampered by the fact that a physical implementation tool is used to make layout modifications based on violation path data from a signoff tool. Specifically, because the analysis performed by the physical implementation tool is significantly less precise than the analysis performed by the signoff tool, the violations detected by the signoff tool are actually not detectable by the implementation tool. Therefore, dealing with those violations using the implementation tool can be a somewhat haphazard, and hence very time-consuming, process. By enabling the transfer of context information for violations (along with the location/path information for those violations) from the signoff tool to the implementation tool, and by enabling the use of that context information in the subsequent layout modifications by the implementation tool, a layout meeting signoff requirements can be efficiently generated.

Figure 3:
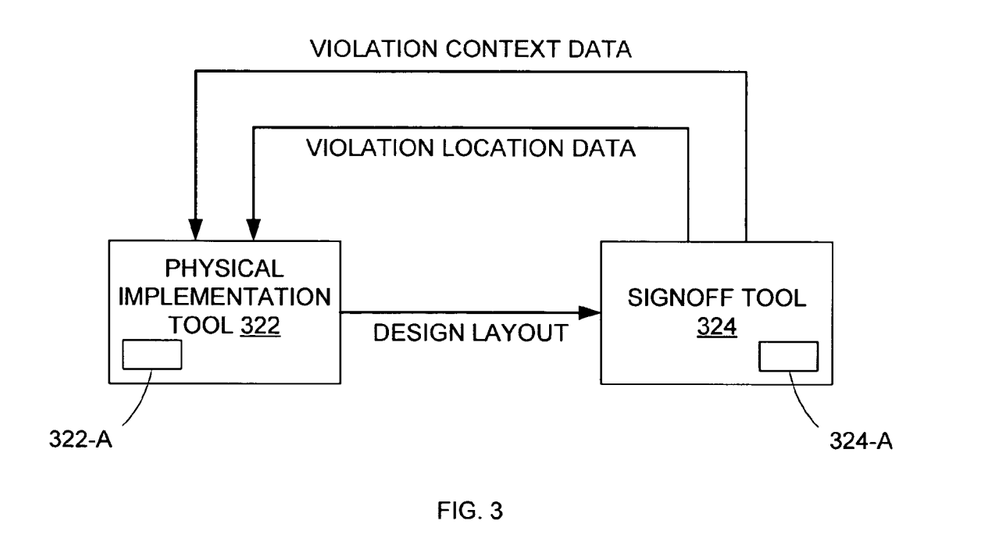
FIG. 3 is a block diagram of an implementation tool and a signoff tool performing a violation context-based ECO process.

FIG. 3 shows an embodiment of an ECO process involving a physical implementation tool 322 and a signoff tool 324. During physical implementation (step E122 in FIG. 1), physical implementation tool 322 generates a design layout for an IC using an implementation analysis module 322-A. This design layout is passed to signoff tool 324, which includes a signoff analysis module 324-A for performing a signoff analysis (step E124 in FIG. 1) on the design layout to check for proper device performance (e.g., proper circuit timing). Signoff analysis module 324-A models the design layout using an accurate signoff algorithm to detect signal paths that exhibit a violation(s) of the design specification for the IC.

Signoff tool 324 sends the violation location data (violation paths) back to physical implementation tool 322. However, unlike conventional ECO processes, signoff tool 324 also compiles and sends violation context data for some or all of those violation paths to physical implementation tool 322. "Context" data for a violation can include any information related to that violation other than the path data. Thus, violation context data can include side input slack (i.e., asynchronous signal arrival at a multi-input device ("side input" refers to an input of the multi-input device that is not in the signal path)), side output slack (i.e., asynchronous signal output from a multi-output device), manual timing overrides (i.e., user-imposed timing constraints and delays that replace calculated values), crosstalk (i.e., signal effects induced by neighboring signals), including crosstalk-induced delays, voltage bumps, and current changes on wires in the signal path and/or on wires and circuit networks not in the signal path (e.g., side input net crosstalk delays)), signal transition time (i.e., the time required to transition between signal states, including input/output delays and slews for devices in and out of the signal path), parasitic extraction (i.e., the detection of parasitic effects on wires and devices in the signal path and/or on wires, devices, and circuit networks not in the signal path), side input drive resistance (i.e., the gate resistance of a non-path input to a multi-input device), output delay sensitivity to slew change (i.e., the relationship between input slew and output delay for a device in the signal path), aggressor circuit net characteristics (i.e., the characteristics of aggressor circuit networks in the design, such as transition times, drive resistances, parasitics, and the coupling details between the aggressor circuit network(s) and the affected victim circuit network(s)), and any other parameters that cause or affect the violation.

Implementation tool 322 can then implement layout modifications that address the violations based on the violation context data provided by signoff tool 324. The violation context data can beneficially reduce or eliminate the involvement of implementation analysis module 322-A in the modification of the design layout. Specifically, the violation context data provides the causal information that implementation analysis module 322-A would typically not be able to determine on its own. By using the accurate violation context data from signoff analysis module 324-A, implementation tool 322 can make effective targeted modifications to the design layout, thereby allowing the ECO process to more rapidly converge on signoff closure. Note that in one embodiment, some manual ECO aspects may still be involved in the process (e.g., allowing manual modifications by a user based on the violation path and/or context data generated by signoff tool 324). In another embodiment, manual intervention can be eliminated due to the effectiveness of the layout modifications enabled by the violation context data, thereby allowing the ECO process to be fully automated (i.e., without user guidance of the layout modifications performed by the implementation tool).

Figure 4:
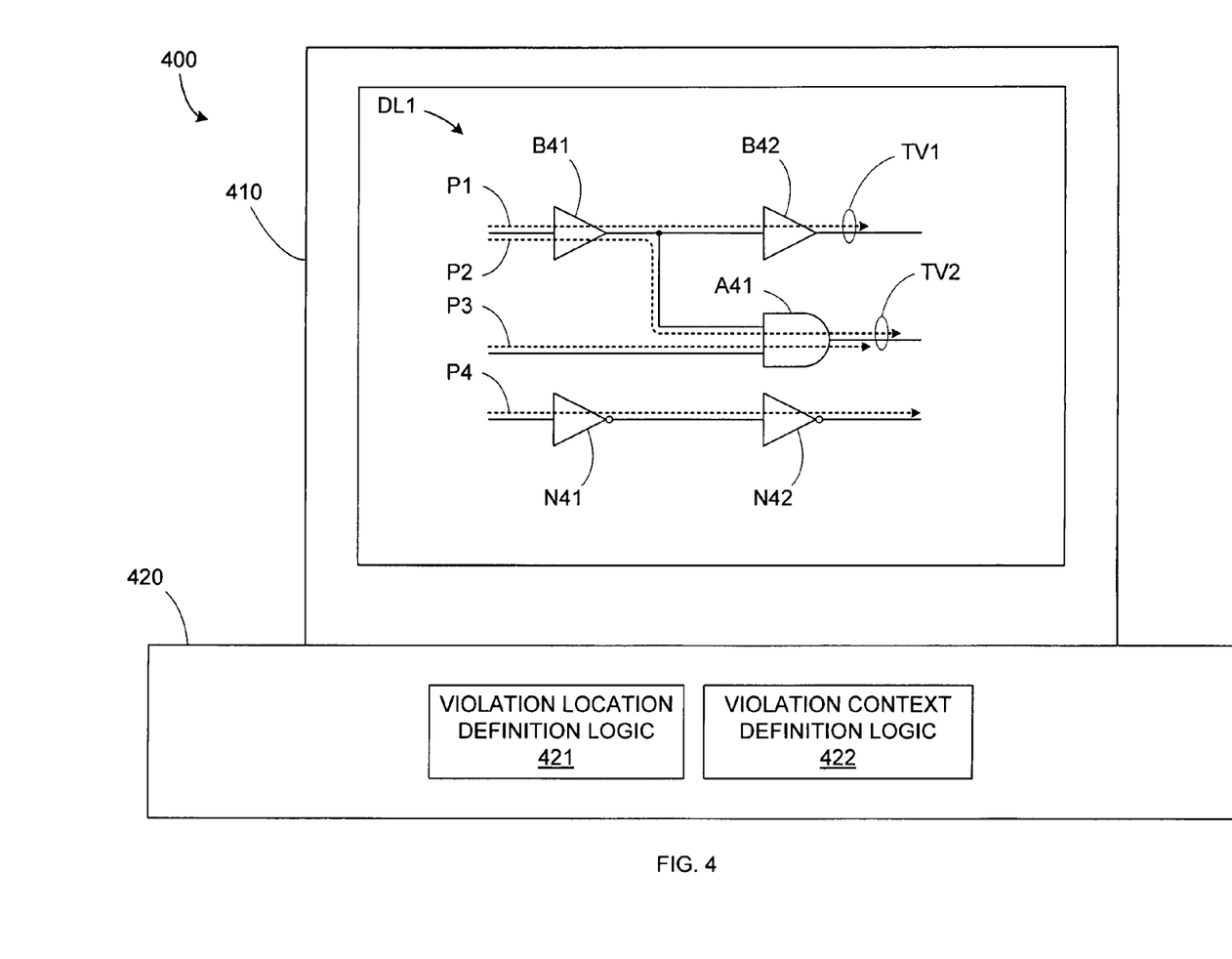
FIG. 4 is a block diagram of a signoff system that includes violation context generation capabilities.

FIG. 4 shows an embodiment of a signoff system 400 for performing signoff analysis as described with respect to FIG. 3. Note that in various embodiments, signoff system 400 as a whole can be considered a "signoff tool", and in various other embodiments, the software program(s) or other logic running within signoff system 400 can be considered the signoff tool. Signoff system 400 includes a graphical display 410 (e.g., a computer monitor) and a processing system 420 (e.g., a personal computer or client workstation). Processing system 420 includes violation location definition logic 421 and violation context definition logic 422. Violation location definition logic 421 can comprise any logic for performing signoff analysis on a design layout to generate violation path data. In one embodiment, violation location definition logic 421 can comprise a conventional signoff tool. Violation context definition logic 422 can comprise any logic for providing (i.e., making available and accessible) violation context data for the violations detected by violation location definition logic 421. In one embodiment, violation context definition logic 422 can be merged with or integrated within violation location definition logic 421 (e.g., in a single software program). Note that violation location definition logic 421 and/or violation context definition logic 422 can comprise software programs (computer instructions) encoded on one or more computer-readable mediums (e.g., hard drives, CD-ROMs, or DVD-ROMs) in processing system 420 or external to processing system 420 (e.g., processing system 420 can be a "thin client" that runs software from a network-attached server).

An example of the operation of signoff system 400 is depicted on graphical display 410. Graphical display 410 shows a design layout DL1 undergoing signoff analysis. Design layout DL1 includes buffers B41, B42, an AND gate A41, and inverters N41 and N42. Buffers B41 and B42 are connected in series, and inverters N41 and N42 are connected in series. AND gate A41 is coupled to receive one of its inputs from the junction between buffers B41 and B42. Design layout DL1 therefore includes four different paths P1, P2, P3, and P4 (indicated by the dotted lines). Path P1 is the signal path from the input of buffer B41 to the output of buffer B42. Path P2 is the signal path from the input of buffer B41 to the output of AND gate AN41. Path P3 is the signal path from an input of AND gate AN41 to the output of AND gate AN41. Finally, path P4 is the signal path from the input of inverter N41 to the output of inverter N42.

Violation location detection logic 421 models design layout DL1 according to an accurate signoff analysis algorithm, and then compares the model performance to a performance specification for the final IC to detect performance violation locations (paths). Meanwhile, violation context definition logic 422 compiles violation context data (i.e., violation information other than the violation path data) for one or more of those violation paths. Note that for exemplary purposes, the operation of signoff system 400 is described with respect to a signoff timing analysis, in which violation location definition logic 421 evaluates the timing characteristics of design layout DL1 against a set of timing specifications. Therefore, the violation context data gathered by violation context definition logic 422 can include data regarding side input slack, side output slack, manual (user) overrides, and crosstalk, among others. In various other embodiments, violation location definition logic 421 could perform similar analyses on any other type of performance parameter during signoff (using an appropriate signoff algorithm), including power consumption, noise, voltage stability (e.g., voltage drop and ground bounce), crosstalk delay, critical DRC (design rule checking) performance (i.e., whether the design layout meets the design rules of the foundry in which the IC will be produced), and electron migration (EM) (i.e., the inability of a wire to sustain high current densities), among others.

To perform a signoff timing analysis, violation location definition logic 421 simulates the behavior of design layout DL1 based on highly accurate mathematical models of an IC produced from design layout DL1. Any signal path that exhibits a timing violation (i.e., deviation from the timing specification) is then classified as a violation path. For example, violation location definition logic 421 may identify a timing violation TV1 by detecting that the simulated signal delay along path P1 (i.e., the time for a signal to propagate from the input of buffer B41 to the output of buffer B42) exceeds an allowable delay in the design specification. Path P1 can then be identified as a violation path. The signoff analysis algorithm could, for example, indicate that the excessive delay along path P1 is due to an unexpectedly large delay in buffer B42. This buffer delay information could then be associated with violation TV1 as part of the violation context for path P1 by violation context definition logic 422.

Violation location definition logic 421 may detect another exemplary timing violation TV2 (along path P2) that is manifested as an excessively delayed signal at the output of AND gate A41. In detecting violation TV2, violation location definition logic 421 may also determine that the slow output of AND gate A41 is caused by a tardy signal along path P3 (sometimes referred to as "side input slack", since the delay on path P2 is due to a gate in path P2 (AND gate A41) waiting for a signal at a different input (from path P3, the "side input")). Violation location definition logic 421 may further detect that the signal delay along path P3 is caused by crosstalk from path P4, but may also find that the overall timing performances of paths P3 and P4 are within the design specifications. Accordingly, only path P2 is marked as a violation path by violation location definition logic 421. However, violation context definition logic 422 associates the delay on path P3 and the crosstalk between paths P3 and P4 with violation TV2. Therefore, unlike conventional signoff systems (e.g., signoff tool 224 shown in FIG. 2), signoff system 400 provides both violation path data and violation context data so that subsequent modifications to design layout DL1 by an implementation tool can make use of that context information.

Figure 5:
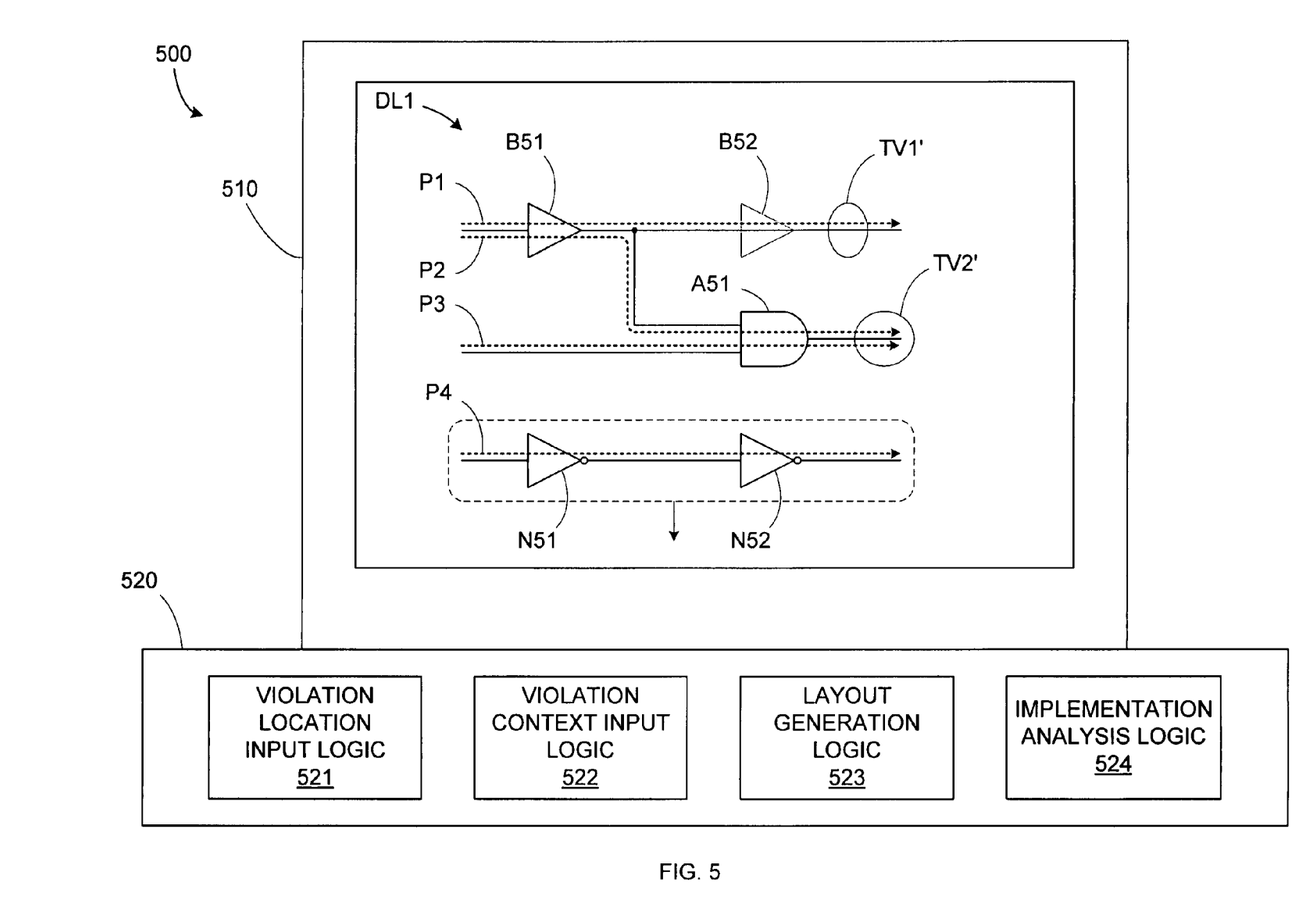
FIG. 5 is a block diagram of an implementation system that includes context-based layout modification capabilities.

FIG. 5 shows an embodiment of an implementation system 500 that can perform design layout modifications based on violation context data from a signoff tool (e.g., as described with respect to FIG. 3). Note that in various embodiments, implementation system 500 as a whole can be considered an "implementation tool", and in various other embodiments, the software program(s) or other logic running within implementation system 500 can be considered the implementation tool. Implementation system 500 includes a graphical display 510 (e.g., a computer monitor) and a processing system 520 (e.g., a personal computer or client workstation). Processing system 520 includes violation location input logic 521, violation context input logic 522, layout generation logic 523, and implementation analysis logic 524. Violation location input logic 521 can comprise any logic for receiving violation location data from a signoff tool (e.g., signoff system 400 in FIG. 4). Violation context input logic 522 can comprise any logic for receiving violation context data from a signoff tool. Layout generation logic 523 can comprise any logic for implementing layout modifications based on violation location data and violation context data. Finally, implementation analysis logic 524 can comprise any logic for applying an implementation analysis algorithm to a design layout (e.g., implementation analysis module 322-A in FIG. 3).

In one embodiment, violation location input logic 521, layout generation logic 523, and implementation analysis logic 524 can comprise standard implementation tool modules (with layout generation logic 523 adapted to use violation context data in addition to, or in place of) data from implementation analysis logic 524. In another embodiment, violation location input logic 521, violation context input logic 522, and/or implementation analysis logic 524 can be integrated within layout generation logic 523 (e.g., in a single software program). Note that in various embodiments, any and/or all of violation location input logic 521, violation context input logic 522, layout generation logic 523, and implementation analysis logic 524 can comprise software programs (computer instructions) encoded on one or more computer-readable mediums (e.g., hard drives, CD-ROMs, or DVD-ROMs) in processing system 520 or external to processing system 520 (e.g., processing system 520 can be a "thin client" that runs software from a network-attached server).

An example of the operation of implementation system 500 is depicted on graphical display 510. Graphical display 510 shows design layout DL1 (described in FIG. 4) undergoing modification in response to the violation location data and the violation context data provided by signoff system 400 shown in FIG. 4. For example, the violation location data from signoff system 400 is received by violation location input logic 521, thereby allowing layout generation logic 523 to identify path P1 as a violation path (due to excessive signal delay indicated by violation TV1 described in FIG. 4). In a conventional implementation system, implementation analysis logic 524 (or a user) would then be required to suggest a source for the excessive delay. However, in implementation system 500, the violation context data from signoff system 400 is received by violation context input logic 522, which in turn allows layout generation logic 523 to identify buffer B52 as being the main cause of the violation. Once the probable cause of the violation is identified, layout generation logic 523 can remove buffer B42 to address the violation for path P1 (the outline of buffer B42 is shown as a dotted line for reference).

Similarly, the violation location data received from signoff tool 400 by violation location input logic 521 allows layout generation logic 523 to identify path P2 as a violation path (due to excessive signal delay at the output of AND gate A41). Violation context input logic 522 receives violation context data from signoff tool 400 that allows layout generation logic 523 to identify the side input slack from path P3, and the crosstalk between paths P3 and P4 causing that side input slack, as being responsible for the timing violation on path P2. Therefore, layout generation logic 523 can increase the spacing between path P3 and path P4 (as indicated by the arrow and dashed oval around path P4) to reduce the crosstalk between paths P3 and P4, thereby reducing the delay on path P3 and eliminating the problematic side input slack at AND gate A51 to address the violation for path P2.

Note that a conventional implementation would rely on implementation analysis logic (e.g., implementation analysis logic 524) or user-supplied guidance (e.g., a manual ECO) to determine an appropriate layout modification to remedy the violation of path P2, resulting in less than optimal layout modifications. For example, due to the reduced-accuracy modeling performed by implementation analysis logic 524, the problematic side input slack along path P3 would be difficult to detect, and the crosstalk between paths P3 and P4 at the root of the problem would be even less likely to be identified. Manual intervention would be faced with similar problems, since the user would have no way to know about either the side input slack or crosstalk, and would have to make educated guesses as to the cause of the violation on path P2. By accepting and applying violation context data from the signoff tool itself, implementation system 500 can provide significantly more appropriate and effective layout modifications in response to signoff violations than would be possible using conventional systems and methods.

Figure 6:
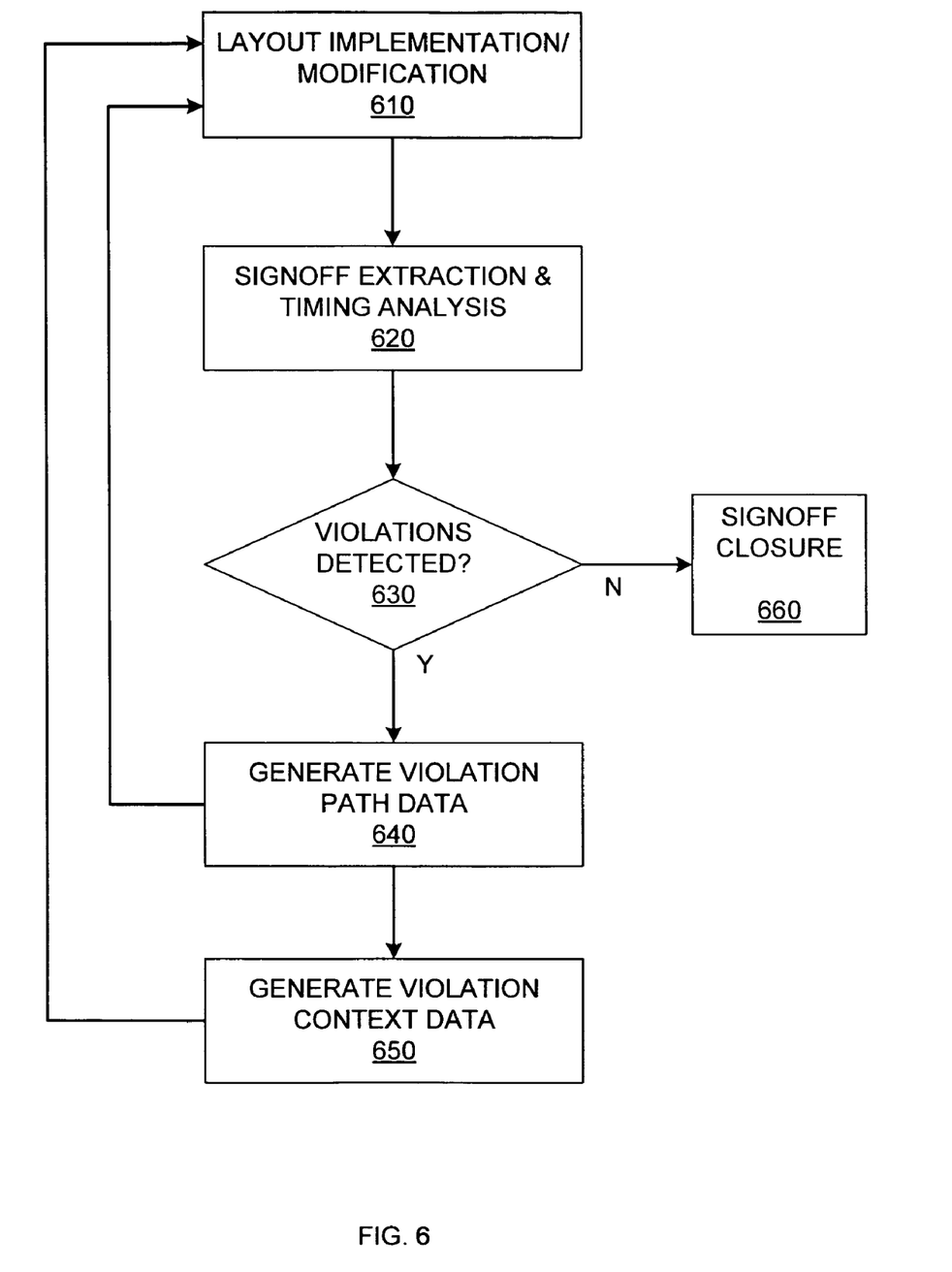
FIG. 6 is a flow diagram of a violation context-based ECO process.

FIG. 6 shows a flow diagram of a signoff process in which violation context data is used to reduce the time to signoff convergence (as described with respect to FIGS. 3, 4, and 5). In a "LAYOUT IMPLEMENTATION/MODIFICATION" step 610, an implementation tool (e.g., implementation system 400 in FIG. 4) implements a physical design layout for an IC (e.g., from a netlist). Then, in a "SIGNOFF EXTRACTION & TIMING ANALYSIS" step 620, a signoff tool (e.g., signoff system 500 in FIG. 5) performs a detailed analysis of the design layout. If any violations of the performance specification are detected in a "VIOLATIONS DETECTED?" step 630, the signoff tool provides the violation path data to the implementation tool in a "GENERATE VIOLATION PATH DATA" step 640. The signoff tool also provides violation context data for the violations to the implementation tool in a "GENERATE VIOLATION CONTEXT DATA" step 650. The implementation tool uses that violation path data and violation context data to modify the design layout in step 610, and the modified layout is provided to the signoff tool for detailed analysis in step 620. The process continues to loop in this manner until no violations are detected by the signoff tool, at which point signoff closure is achieved and step 630 proceeds to "SIGNOFF CLOSURE" step 660.

The various embodiments of the structures and methods of this invention that are described above are illustrative only of the principles of this invention and are not intended to limit the scope of the invention to the particular embodiments described. Thus, the invention is limited only by the following claims and their equivalents.

The invention claimed is:

1. A method for achieving signoff closure for a design layout for an integrated circuit (IC), the method comprising:
   analyzing the design layout using a signoff algorithm in a signoff tool to detect a set of violation paths and to generate context data for one or more of the set of violation paths, wherein each of the set of violation paths consists of a signal path in the design layout exhibiting a violation of a design specification for the IC, and wherein the context data comprises violation information other than violation path information;
   implementing changes to the design layout in an implementation tool based on the set of violation paths and the context data; and
   repeating the steps of analyzing and implementing until the design layout meets the design specification according to the signoff algorithm.

2. The method of claim 1, wherein the signoff algorithm comprises a timing analysis algorithm.

3. The method of claim 2, wherein the violation context data comprises data for at least one of side input slack, side output slack, manual timing overrides, crosstalk, signal transition time, parasitic extraction, side input drive resistance, output delay sensitivity to slew change, and aggressor circuit net characteristics.

4. The method of claim 3, wherein crosstalk comprises crosstalk-induced delays, voltage bumps, current changes on wires in the signal path, and current changes on wires in the IC,
   wherein signal transition time comprises input delays, output delays, input slews, and output slews,
   wherein parasitic extraction comprises parasitic effects on wires and devices in the IC, and
   wherein the aggressor circuit net characteristics comprise aggressor circuit net transition times, aggressor circuit net drive resistances, aggressor circuit net parasitics, and aggressor circuit net-victim circuit net coupling details.

5. The method of claim 1, wherein the signoff algorithm comprises at least one of a power consumption analysis algorithm, a noise analysis algorithm, a voltage stability analysis algorithm, a crosstalk delay analysis algorithm, a critical DRC analysis algorithm, and an electron migration analysis algorithm.

6. The method of claim 1, wherein the step of implementing changes comprises modifying the design layout based on the set of violation paths and the context data using an implementation tool.

7. The method of claim 6, wherein the step of implementing changes is performed without user guidance of the implementation tool.

8. A tool comprising:
logic for providing a set of violation paths, wherein each of the set of violation paths comprises a signal path in a design layout exhibiting a violation of a design specification;
logic for providing violation context data for one or more violation paths in the set of violation paths, wherein the violation context data comprises violation information other than signal path information; and
logic for providing the set of violation paths and the violation context data to a physical implementation tool for optimized design layout modifications if violations are detected,
wherein the violation context data comprises data for at least one of side input slack, side output slack, manual timing overrides, crosstalk, signal transition time, parasitic extraction, side input drive resistance, output delay sensitivity to slew change, and aggressor circuit net characteristics.

9. The tool of claim 8, wherein crosstalk comprises crosstalk-induced delays, voltage bumps, current changes on wires in the signal path, and current changes on wires in the IC,
wherein signal transition time comprises input delays, output delays, input slews, and output slews,
wherein parasitic extraction comprises parasitic effects on wires and devices in the IC, and
wherein the aggressor circuit net characteristics comprise aggressor circuit net transition times, aggressor circuit net drive resistances, aggressor circuit net parasitics, and aggressor circuit net-victim circuit net coupling details.

10. The tool of claim 8, wherein the signoff algorithm comprises at least one of a power consumption analysis algorithm, a noise analysis algorithm, a voltage stability analysis algorithm, a crosstalk delay analysis algorithm, a critical DRC performance analysis algorithm, and an electron migration analysis algorithm.

11. A tool comprising:
logic for receiving a set of violation path data from a signoff analysis performed by a signoff tool, each of the set of violation path data identifying a signal path in a design layout of an integrated circuit (IC) exhibiting a violation of a design specification;
logic for receiving violation context data from the signoff analysis, the violation context data comprising non-signal path information for one or more violation paths in the set of violation path data; and
logic for modifying the design layout in an implementation tool based on the set of violation path data and the violation context data.

12. The tool of claim 11, wherein the signoff analysis comprises a timing analysis.

13. The tool of claim 12, wherein the violation context data comprises data for at least one of side input slack, side output slack, manual timing overrides, crosstalk, signal transition time, parasitic extraction, side input drive resistance, output delay sensitivity to slew change, and aggressor circuit net characteristics.

14. The tool of claim 13, wherein crosstalk comprises crosstalk-induced delays, voltage bumps, current changes on wires in the signal path, and current changes on wires in the IC,
wherein signal transition time comprises input delays, output delays, input slews, and output slews,
wherein parasitic extraction comprises parasitic effects on wires and devices in the IC, and
wherein the aggressor circuit net characteristics comprise aggressor circuit net transition times, aggressor circuit net drive resistances, aggressor circuit net parasitics, and aggressor circuit net-victim circuit net coupling details.

15. The tool of claim 11, wherein the signoff analysis comprises at least one of a power consumption analysis algorithm, a noise analysis algorithm, a voltage stability analysis algorithm, a crosstalk delay analysis algorithm, a critical DRC performance analysis algorithm, and an electron migration (EM) analysis algorithm.

16. A computer-readable medium encoded with a program for controlling the operation of a computer, the program comprising:
a first set of instructions for causing the computer to analyze a design layout of an integrated circuit (IC) using a signoff algorithm;
a second set of instructions for causing the computer to provide a set of violation paths, wherein each of the set of violation paths comprises a signal path in the design layout exhibiting a violation of a design specification; and
a third set of instructions for causing the computer to provide violation context data, as generated by a signoff tool, for one or more violation paths in the set of violation paths, wherein the violation context data comprises violation information other than signal path information; and
a fourth set of instructions for modifying the design layout in an implementation tool based on the set of violation paths and the violation context data.

17. The computer-readable medium of claim 16, wherein the signoff algorithm comprises a timing analysis algorithm, and
wherein the violation context data comprises data for at least one of side input slack, side output slack, manual timing overrides, crosstalk, signal transition time, parasitic extraction, side input drive resistance, output delay sensitivity to slew change, and aggressor circuit net characteristics.

18. The computer-readable medium of claim 17, wherein crosstalk comprises crosstalk-induced delays, voltage bumps, current changes on wires in the signal path, and current changes on wires in the IC,
wherein signal transition time comprises input delays, output delays, input slews, and output slews,
wherein parasitic extraction comprises parasitic effects on wires and devices in the IC, and
wherein the aggressor circuit net characteristics comprise aggressor circuit net transition times, aggressor circuit net drive resistances, aggressor circuit net parasitics, and aggressor circuit net-victim circuit net coupling details.

19. The computer-readable medium of claim 16, wherein the signoff algorithm comprises at least one of a power consumption analysis algorithm, a noise analysis algorithm, a voltage stability analysis algorithm, a crosstalk delay analysis algorithm, a critical DRC performance analysis algorithm, and an electron migration (EM) analysis algorithm.

20. A computer-readable medium encoded with a program for controlling the operation of a computer, the program comprising:
- a set of instructions for modifying a design layout of an integrated circuit (IC) based on a set of violation path data from a signoff analysis and violation context data from the signoff analysis, the signoff analysis and the violation context data being generated by a signoff tool,
- wherein each violation path in the set of violation path data identifies a signal path in a design layout exhibiting a violation of a design specification,
- wherein the violation context data comprises non-signal path information for one or more violation paths in the set of violation path data,
- wherein the signoff analysis comprises a timing analysis, and
- wherein the violation context data comprises data for at least one of side input slack, side output slack, manual timing overrides, crosstalk, signal transition time, parasitic extraction, side input drive resistance, output delay sensitivity to slew change, and aggressor circuit net characteristics.

21. The computer-readable medium of claim 20, wherein crosstalk comprises crosstalk-induced delays, voltage bumps, current changes on wires in the signal path, and current changes on wires in the IC,
- wherein signal transition time comprises input delays, output delays, input slews, and output slews,
- wherein parasitic extraction comprises parasitic effects on wires and devices in the IC, and
- wherein the aggressor circuit net characteristics comprise aggressor circuit net transition times, aggressor circuit net drive resistances, aggressor circuit net parasitics, and aggressor circuit net-victim circuit net coupling details.

22. The computer-readable medium of claim 20, wherein the signoff analysis comprises at least one of a power consumption analysis algorithm, a noise analysis algorithm, a voltage stability analysis algorithm, a crosstalk delay analysis algorithm, a critical DRC performance analysis algorithm, and an electron migration (EM) analysis algorithm.

* * * * *